United States Patent [19]

Schmid et al.

[11] Patent Number: 4,882,668
[45] Date of Patent: Nov. 21, 1989

[54] ADAPTIVE MATCHED FILTER

[75] Inventors: Hans-Peter Schmid, Upland; Richard S. Schlunt, Loma Linda, all of Calif.

[73] Assignee: General Dynamics Corp., Pomona Division, Pomona, Calif.

[21] Appl. No.: 131,065

[22] Filed: Dec. 10, 1987

[51] Int. Cl.⁴ .......................................... G06F 15/336
[52] U.S. Cl. ............................. 364/600; 364/728.03; 364/724.11; 364/724.17
[58] Field of Search .............. 364/600, 602, 604, 825, 364/826, 827, 724.01, 724.19, 724.11, 724.17, 725, 728.03, 728.07, 728.05

[56] References Cited

U.S. PATENT DOCUMENTS

| | | |
|---|---|---|
| 3,303,335 | 2/1967 | Pryor . |
| 3,889,108 | 6/1975 | Cantrell . |
| 3,894,219 | 7/1975 | Weigel . |
| 3,925,646 | 12/1975 | Richardson et al. . |
| 3,925,648 | 12/1975 | Speiser et al. . |
| 3,942,035 | 3/1976 | Buss . |
| 3,950,635 | 4/1976 | Constant ..................... 364/724.11 |
| 3,987,292 | 10/1976 | Means . |
| 3,987,293 | 10/1976 | Crooke et al. . |
| 4,006,351 | 2/1977 | Constant ..................... 364/724.11 |
| 4,034,199 | 7/1977 | Lampe et al. . |
| 4,038,539 | 7/1977 | Van Cleave . |
| 4,044,241 | 8/1977 | Hatley, Jr. . |
| 4,049,958 | 9/1977 | Hartmann . |
| 4,071,906 | 1/1978 | Buss . |
| 4,093,989 | 6/1978 | Flink et al. . |
| 4,118,784 | 10/1978 | Nussbaumer . |
| 4,120,035 | 10/1978 | Cases et al. . |
| 4,188,667 | 2/1980 | Graupe et al. ................ 364/724.17 |
| 4,218,752 | 8/1980 | Hewes et al. ............. 364/724.16 X |
| 4,355,368 | 10/1982 | Zeidler et al. ................ 364/728.03 |

Primary Examiner—Michael R. Fleming
Attorney, Agent, or Firm—Henry Bissell; Leo R. Carroll

[57] ABSTRACT

An apparatus provides matched filter output characteristics for known signals embedded in noise signals that have varying noise power distributions. The system correlates applied signals with a manipulated version of the applied signals in an analog-to-analog correlator. The manipulated signals are derived by Fourier transforming the applied signals and estimating the noise power spectral density. A filter transfer function is then calculated using the noise power estimates and stored information related to the characteristics of the known signal. The transfer function is then inverse Fourier transformed to provide a filter impulse response characteristic which is correlated with the applied signals. A method of processing applied signals to provide for an enhanced signal-to-noise ratio for varying noise power distributions is also disclosed.

9 Claims, 3 Drawing Sheets

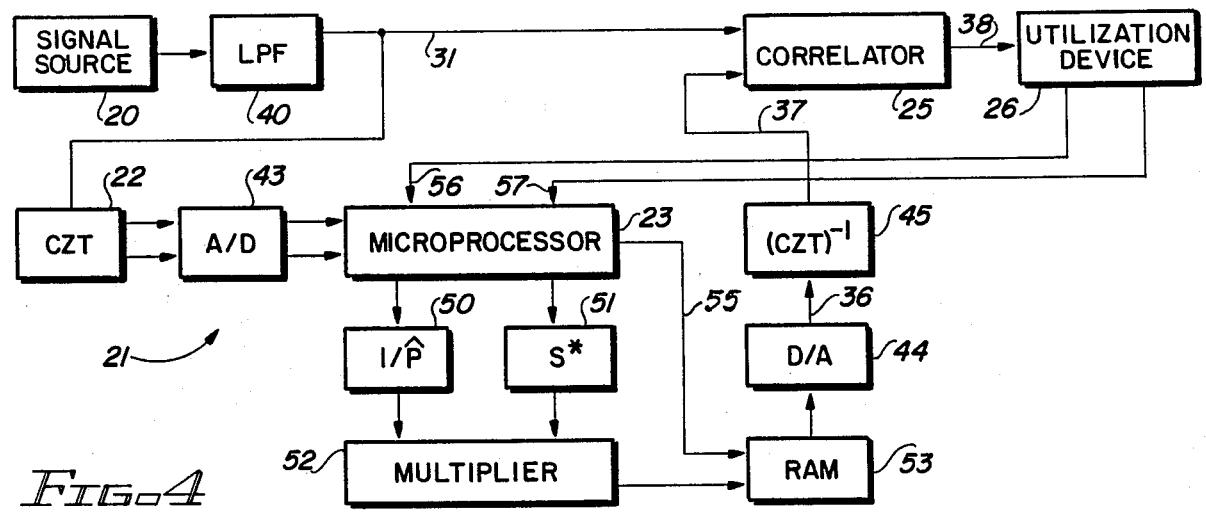
_Fig. 4_
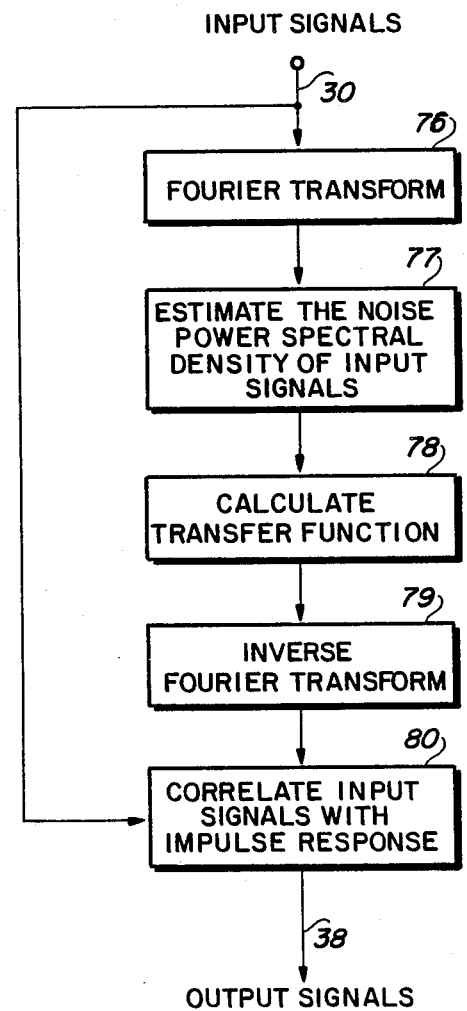
_Fig. 6_

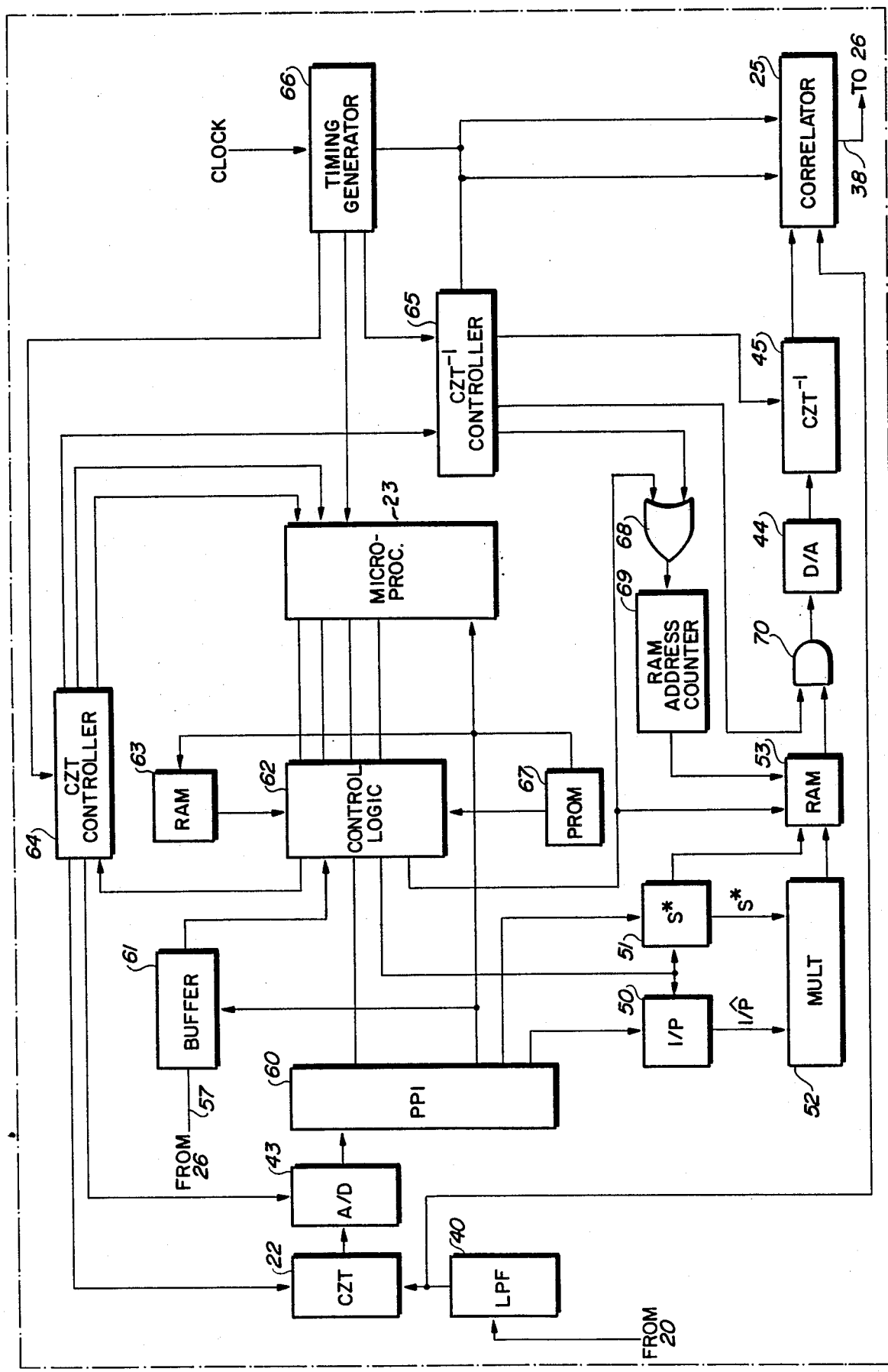

ADAPTIVE MATCHED FILTER

BACKGROUND OF THE INVENTION

1. Field of the Invention.

The present invention relates generally to adaptive matched filters and more particularly to adaptive matched filters which adapt the filter characteristic based on the noise power spectral density.

2. Description of the Related Art.

There are many systems which must process or detect a signal of known spectral content which is in the presence of background noise. Such systems may include communication systems, infrared detection systems, radar systems, and video systems, or the like. If the system is operating at a very low signal-to-noise ratio, the known signal is usually embedded in the noise. The problem at hand is to first determine if the known signal is present in the noise, and then having found this signal, provide an output signal which has an enhanced signal-to-noise ratio.

A common approach to this problem is to use a filter which maximizes the ratio of peak signal to the noise power at one instant in time. Such a filter is termed a matched filter. Generally, this filter is specifically designed for a given background noise and a given signal of known amplitude-time history. The desired filter characteristic may be determined by utilizing Fourier analysis techniques.

For example, if the input signal x(t) to the matched filter is comprised of a signal s(t) and an additive noise signal n(t), which may be expressed as $x(t)=s(t)+n(t)$, then the matched filter characteristic is determined as provided hereinbelow. Defining $S(\omega)$ as the Fourier transform of s(t), and assuming that the noise signal has zero mean and power spectral density $P(\omega)$, the output of a filter with transfer function $H(\omega)$ may be described as $$Y_s(t) = 1/(2\pi) \int_{-\infty}^{\infty} H(\omega)S(\omega)e^{j\omega t} d\omega \quad (1)$$

$$W = 1/(2\pi) \int_{-\infty}^{\infty} |H(\omega)|^2 P(\omega) d\omega \quad (2)$$

In these equations $y_s(t)$ is the output component at the matched filter output due to the signal s(t) and W is the output power due to the noise n(t). Maximizing the ratio of the peak signal to the noise power results in $$H(\omega)=S^*(\omega)/P(\omega) \quad (3)$$

where $S^*(\omega)$ is the complex conjugate of $S(\omega)$. A fixed mechanization of this filter will only be optimum for signal and noise characteristics used in determining $H(\omega)$. In the time domain, $H(\omega)$ corresponds to the linear causal time-invariant filter whose impulse response h(t) is the inverse Fourier transform of $H(\omega)$. In the above equations, the use of "t" indicates signals in the continuous time domain, and the use of "$\omega$" indicates signals in the frequency domain.

Because the above-described filter is only optimal for specified signal and noise characteristics, it has no flexibility. Accordingly, numerous devices have been invented which attempt to provide some flexibility to the matched filter, and hence provide an adaptive matched filter. For example, in U.S. Pat. No. 3,889,108 an "Adaptive Low Pass Filter" is disclosed which adaptively changes its bandwidth filtering characteristics in accordance with the bandwidth of the incoming signal. This adaptive filer is designed to pass low-frequency components below a selected low-frequency cutoff point. The filter cutoff point may be increased to a higher frequency or decreased to a lower frequency by utilizing prior signal inputs and outputs of the filter. U.S. Pat. No. 4,038,539, for "Adaptive Pulse Processing Means and Method", provides for a digital system which generates a filter function based on the frequency characteristics of the input signal.

U.S. Pat. No. 4,034,199, for a "Programmable Analog Transversal Filter", discloses a filter which provides for a programmable finite impulse response. A plurality of filter taps are provided which allow an applied signal to be variably weighted in accordance with a program. This system permits the implementation of complex signal processing with particular implementation of Fourier transforms, matched filters, correlators, and adaptive type filters, by selecting the proper control program.

U.S. Pat. No. 4,044,241, for an "Adaptive Matched Digital Filter," provides for a digital filter which is of the transversal type, whose multiplier coefficients are controlled and periodically updated by a digital computer. The computer samples the incoming noise and signal at frequent intervals in order to monitor any changes in the noise environment. The computer calculates and sets optimum filter constants for a given noise environment.

U.S. Pat. No. 3,303,335, entitled "Digital Correlation System Having an Adjustable Impulse Generator", provides for a digital filtering system wherein the synthesizing of the desired input response is carried out directly in the time domain through automatic and repeated evaluation of the convolution integral.

Although numerous adaptive matched filters have been designed, no such filters have attempted to adapt the filter characteristic as a function of the noise power spectral density for a given form of signal. Hence, it would be an improvement in the electronic filtering art to provide for an adaptive matched filter which adapts the filter characteristic as a function of the noise power spectral density.

SUMMARY OF THE INVENTION

In accordance with the present invention there is provided an adaptive matched filter which maintains the matched filter characteristic for varying background noise characteristics. More particularly, an adaptive matched filter system is provided in which the input signal plus noise is correlated with a manipulated version of itself in an analog-to-analog correlator. The manipulated input to the correlator is derived by Fourier transforming the input signal and squaring the Fourier transformed signal. This signal is then digitized and applied to a microprocessor which calculates the transfer function of the matched filter in the frequency domain. The transfer function is then Fourier transformed into the time domain to provide the matched filter impulse response. The impulse response is then correlated with the applied signals in the analog-to-analog correlator to provide the matched filter output signal.

The present invention also provides for a method of processing applied signals containing known signals and noise inputs, which maximizes the signal-to-noise power ratio for varying noise power distributions. The steps of the method include Fourier transforming the applied signals and then estimating the power spectral density of the applied signals. The noise power spectral density is then determined and a transfer function is calculated based on the noise power spectral density estimates and stored information characterizing the known signals. The transfer function is then inverse Fourier transformed to produce impulse response signals. The applied signals are then correlated with the impulse response signals to produce an output signal having a maximum signal-to-noise power ratio.

BRIEF DESCRIPTION OF THE DRAWINGS

A better understanding of the present invention may be gained from a consideration of the following detailed description, taken in conjunction with the accompanying drawings in which:

FIG. 4 shows a more detailed block diagram of the filter of FIG. 2;

FIG. 5 shows a very detailed block diagram of the adaptive matched filter implementation of FIG. 2; and FIG. 6 is a flow chart which illustrates the steps in the method of the present invention.

DETAILED DESCRIPTION OF THE INVENTION

Figure 1:
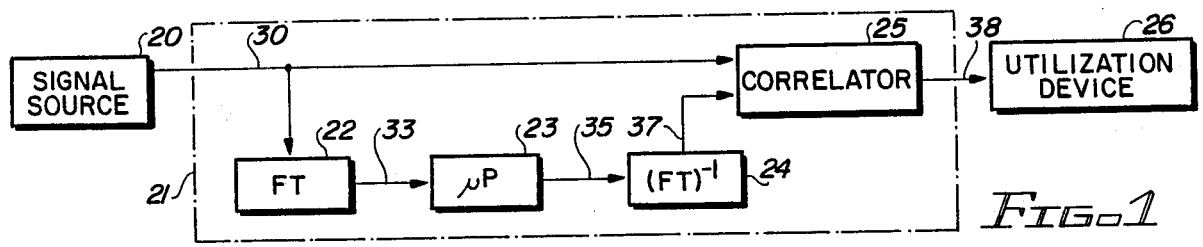
FIG. 1 shows the basic matched filter design in accordance with the present invention.

Referring to FIG. 1, there is shown a block diagram of circuitry which implements the adaptive matched filter of the present invention. A signal source 20 provides input signals 30, comprised of known signals and noise signals, to an adaptive matched filter 21. The input signals are applied to Fourier transform circuitry 22 which implements the Fourier transform of the input signals, and the input signals 30 are also applied to one input of a correlator 25. The output of the Fourier transform circuitry 22 is applied to an input of a microprocessor 23, which calculates the transfer function of the adaptive matched filter 21. The output signals 33 of the Fourier transform circuitry 22 are indicative of the power spectral density of the input signals 30. The output signals 35 of the microprocessor 23 are derived from the output signals 33 of the Fourier transform circuitry 22 and stored data which is indicative of the spectral content of the known signals.

The stored data is generated independently of the present invention and may be based on test data, or simulation data, or the like. This externally generated data is compiled on a target or set of targets in a typical radar application, for example. In a typical communications application, the known signals may be encoded signals transmitted by a transmitter, or the like. Thus, the spectral distribution of the known signal is determined prior to utilization of information relating thereto by the present invention. This information is stored in the microprocessor 23 for use in the present invention.

The output signals 35 are applied to inverse Fourier transform circuitry 24 which transforms the matched filter transfer function back into the time domain. The output signals of the inverse Fourier transform circuitry 24 are the time domain impulse response signals 37 of the matched filter 21. The impulse response signals 37 are applied to a second input of the correlator 25, and the correlator 25 combines the impulse response signals 37 and the input signals 30 in a predetermined manner to provide an output signal 38 which has a maximum signal-to-noise power ratio. The output signals 38 of the matched filter 21 are applied to a utilization device 26, such as further signal processing circuitry, or the like.

Figure 2:
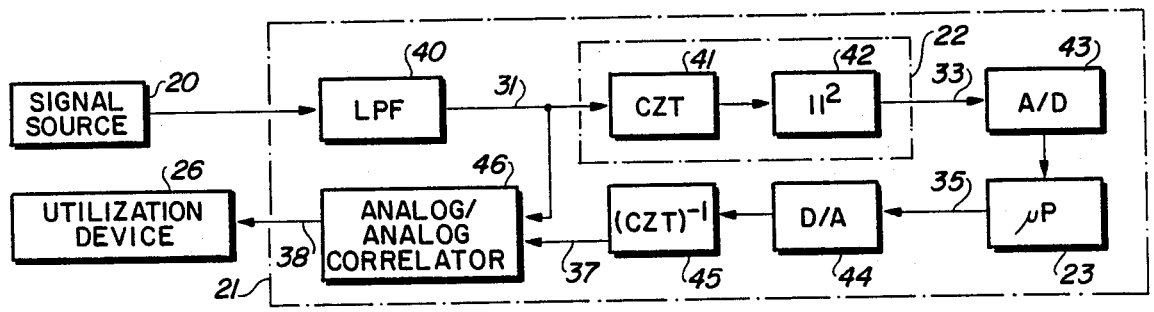
FIG. 2 shows a more detailed embodiment of the present invention.

Referring now to FIG. 2, there is shown a more detailed version of the matched filter shown in FIG. 1. The matched filter 21 of FIG. 2 further includes a low-pass filter 40 which is coupled to the signal source 20 to prefilter the input signals 30 so as to limit the bandwidth of the matched filter 21. The low-pass filter 40 is employed to eliminate aliasing. The output signals 31 from the low-pass filter 40 are applied to Fourier transform circuitry 22 that includes chirp-z-transform circuitry 41, which provides the Fourier transform of signals applied thereto, and squaring circuitry 42, which provides output signals 33 which are the square of signals provided by the chirp-z-transform circuitry 41.

The output signals 33 are converted to digital signals by an analog-to-digital converter 43 and applied to the microprocessor 23. The microprocessor 23 provides output signals 35 which are indicative of the transfer function of the matched filter 21, and these signals are converted back into analog form by a digital-to-analog converter 44. The output from the digital-to-analog converter 44 is applied to chirp-z-transform circuitry 45 which provides the inverse Fourier transform of the matched filter transfer function to provide the matched filter impulse response signals 37. The analog-to-analog correlator 46 combines the output signals 31 from the low-pass filter 40 and the impulse response 37 to provide the matched filter output signals 38.

Figure 3:
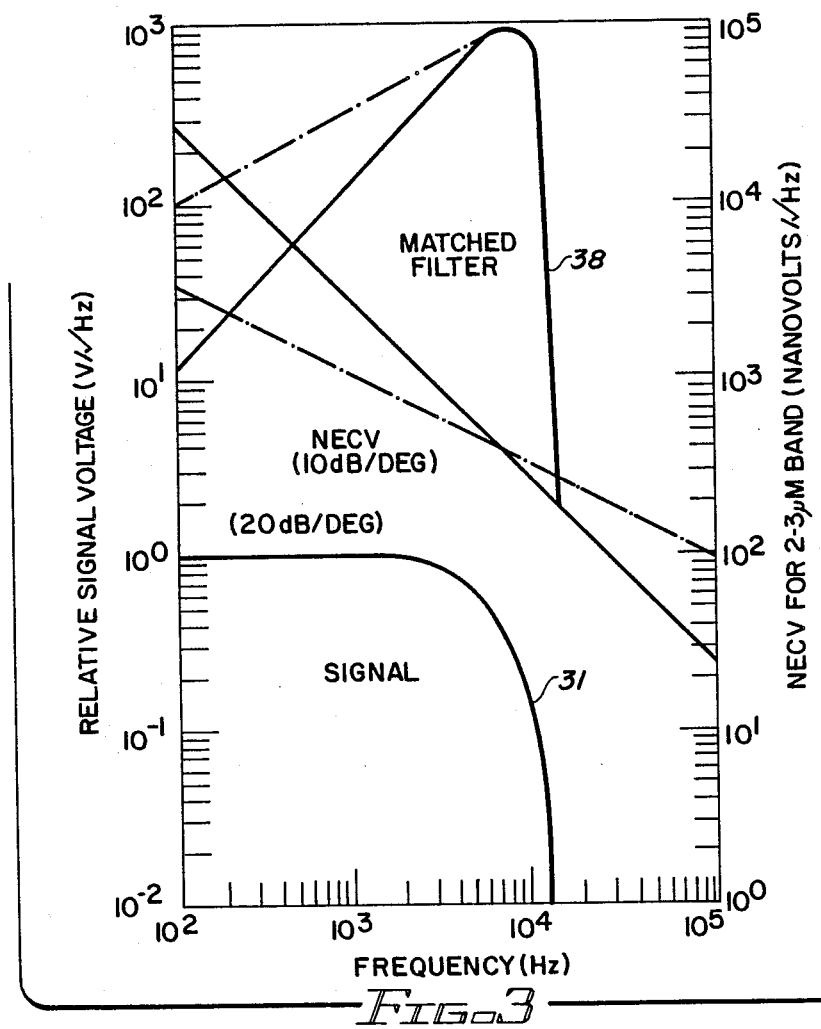
FIG. 3 shows a graph which illustrates the matched filter output as a function of input signal and background noise.

Referring to FIG. 3, there is shown a graph of voltage versus frequency which includes the input signal 31 after it has been Fourier transformed, the background noise identified by the term NECV, and the matched filter frequency response (transfer function) for two noise power distributions. As may be seen from FIG. 3, the matched filter characteristics vary in response to changes in the noise power distribution in order to maintain a maximum signal-to-noise power ratio.

Referring again to FIG. 2, the chirp-z-transform circuitry 41 may implement what is commonly known as a sliding chirp-z-transform, which comprises a plurality of charge-coupled device (CCD) finite impulse response filters. Four chirp-weighted filters may be utilized to mechanize the complete chirp-z-transform circuitry 41. However, it is to be understood that the present invention is not limited to the use of the sliding chirp-z-transform as described hereinabove. Clearly numerous and varied other arrangements may be devised which would implement the Fourier transform of the input signals. In particular, U.S. Pat. No. 3,942,035 for "Charge Coupled Device Signal Processing Apparatus Using Chirp-z-Transform Techniques", U.S. Pat. No. 4,049,958 for "Programmable Filter Using Chirp-z-Transform", U.S. Pat. No. 3,925,648 for "Apparatus For the Generation of High Capacity Chirp-z-Transform", and U.S. Pat. No. 3,987,292 for "Discrete Fourier Transform Via Cross Correlation Charge Transfer Device" show various Fourier transform techniques which could be adapted for use with the present invention. In addition, the above techniques may be adapted to implement the inverse Fourier transform circuitry 45. The analog-to-analog correlator 46 of FIG. 2 is well-known in the art, and commercial units such as the EG&G Model R5403 analog-to-analog correlator/convolver are available to perform the desired correlation in the present invention.

More particularly, the chirp-z-transform circuitry 41 provides an estimate of the power spectral density of the filtered output signals 31 provided by the low-pass filter 40. The chirp-z-transform circuitry 41 computes this estimate based on the equation $$F_N^P(k) = (g*h)(k + PN)e^{-j\pi/N}e^{j\pi(k+1)2/N} \tag{4}$$

where $(g*h)$ is the convolution of g and h evaluated at $k+PN$.

The quantities g and h are defined by the equations $$g(n) = \begin{cases} f(nT)e^{-j\pi(n-1)2/N} & n = 1,2,3,\ldots N \\ 0 & \text{otherwise.} \end{cases}$$

where $f(nT)$ is the input signal sampled at time $nT$, and $$h(n) = \begin{cases} e^{j\pi n^2/N} & n = 1,2,3,\ldots N \\ 0 & \text{otherwise.} \end{cases}$$

Given that P is a positive integer and N is an even integer, then $$\begin{aligned}(g*h)(k + PN) &= \sum_{\mu=-\infty}^{\infty} g(\mu)h(k + PN - \mu) \\ &= \sum_{k+(P-1)N}^{k+PN-1} g(\mu)h(k + PN - \mu) \\ &= e^{-j\pi(k-1)2/N} \sum_{n=0}^{N-1} f((n + k + (P - 1)N)T)e^{-j2\pi nk/N} \\ &= e^{-j\pi(k-1)2/N} F_N^P(k)\end{aligned} \tag{5}$$

Where $F^P_N(k)$ is the Finite Discrete Fourier Transform (FDFT) of the set $$f((k+P-1)N)T),\ldots f((k+PN)T) \tag{6}$$

evaluated at $2\pi k/NT$, where $k=0, 1, 2, \ldots N-1$.

F(k) is then squared digitized, and applied to the microprocessor 23. The microprocessor 23 computes the best estimate of the noise power spectral density $P(k)$ as given by the recursive relationship $$P_n(k) = a_n P_{n-1}(k) + b_n |F_N^{n-1}(k)|^2 \tag{7}$$

where $F^{n-1}N(k)$ is the latest Discrete Fourier Transform (DFT) update calculated on the last N pieces of data available, $P_n(k)$ is the linear mean squared estimate of $P(k)$, and $a_n$ and $b_n$ are such that $b_n=1-a_n$. Once $P_n(k)$ is determined, the transfer function of the filter 21 is calculated and is given by $$H(\omega)=S^*(\omega)/P_n-1(\omega) \tag{8}$$

where $S^*(\omega)$ is the complex conjugate of $S(\omega)$.

As mentioned hereinabove, $S^*(\omega)$ information, externally generated, is stored in a memory portion of the microprocessor 23. This stored information is extracted from the memory as required to calculate $H(\omega)$ in Equation (8).

As used in the equations presented herein "t" indicates signals in the continuous time domain, "w" indicates frequency domain, and "k" indicates discrete time domain signals.

The transfer function $H(\omega)$ of the matched filter 21 is then inverse Fourier transformed to produce the impulse response $h(t)$ of the matched filter 21. The impulse response and the filtered input signals are applied to the analog-to-analog correlator 46 which implements the convolution $$y(n) = \sum_{n=0}^{N-1} h(n)x(k - n) \tag{9}$$

Thus the desired matched filter output $y(n)$ is provided in real time and has been adapted for the particular noise power spectral density in which the known signal is embedded. Changes in the background noise power distribution will result in changes in the transfer function of the filter, but the maximum signal-to-noise power ratio will be maintained.

Referring to FIG. 4, there is shown a more detailed block diagram of the matched filter shown in FIG. 2. FIG. 4 further delineates circuitry which is controlled by the microprocessor 23, and which implements the calculation of the matched filter transfer function. Circuit 50 implements the computation of $1/\hat{P}$, while circuit 51, which comprises a memory portion, provides the $S^*$ data. These are the two required quantities needed to determine the filter transfer function $H(\omega)$. The outputs of circuits 50, 51 are applied to a multiplier 52 which combines the $1/\hat{P}$ and $S^*$ outputs of the circuits 50, 51 to obtain the filter transfer function. The output of the multiplier 52 is applied to a random access memory (RAM) 53 which stores the filter transfer function. Various control and sync signals are provided, including a state channel signal 55 which controls the operation of the random access memory 53. Synchronization signals 56 are provided from the utilization device 26 to the microprocessor 23 to synchronize the signal flow from the matched filter 21 to the utilization device 26. Control signals 57 are provided from the utilization device 26 to control the output of the matched filter 21 when the known signals are detected. If no known signals are present in the noise, then control signals 57 are provided to the microprocessor 23 which allow the filter transfer function stored in the random access memory 53 to be updated with the current value based on the latest noise power distribution. Once a known signal has been detected, the control signal 57 applied to the microprocessor 23 switches the random access memory 53 into a read-only mode. In this circumstance, the random access memory 53 outputs the same matched filter transfer function until the known signal is no longer present in the noise.

Referring now to FIG. 5, there is shown a detailed block diagram illustrating the adaptive matched filter of the present invention. In addition to the circuitry described with reference to FIGS. 1, 2, and 4, FIG. 5 further includes a parallel peripheral interface (PPI) 60 which receives digital input signals from the analog-to-digital converter 43, and applies these signals to the microprocessor 23 and to a buffer 61. The buffer 61 receives control signals 57 from the utilization device 26 which ultimately controls the random access memory 53. Control logic 62 is provided which interfaces between the microprocessor 23, buffer 61, parallel peripheral interface 60, a workspace random access memory 63, and a chirp-z-transform controller 64. The workspace memory 63 receives input signals and provides signals to the control logic 62. The control logic 62 provides signals to the chirp-z-transform controller 64 in order to control its operation. In addition, control logic signals are provided to the inverse chirp-z-transform controller 65 through the chirp-z-transform controller 64. The controllers 64, 65 perform timing and synchronization operations in the filter of FIG. 5. A programmable read-only memory (PROM) 67 is provided which receives the input signals and applies control signals in response thereto to the control logic 62.

The control logic 62 also provides signals to the random access memory 53 and to one input of an OR gate 68. The other input of the OR gate is connected to the inverse chirp-z-transform controller 65. The output of the OR gate 68 is connected to a RAM address counter 69 whose output is connected to the random access memory 53. The inverse chirp-z-transform controller 65 is also connected to one input of an AND gate 70 while the other input of the AND gate is connected to the output of the random access memory 53. A timing generator 66 is connected to a source of clock signals and provides output signals at various rates to control the operation of the chirp-z-transform controller 64, microprocessor 23, inverse chirp-z-transform controller 65, and correlator 25.

Inputs to the 8×8 multiplier 52 are provided by the outputs of 1/$\hat{P}$ box 50 and S* box 51. The output of 1/$\hat{P}$ box 50 is the inverse of its input. A memory in S* box 51 contains S* and is read out at the appropriate time.

In the specific embodiment shown in FIG. 5, a Zilog Model Z-80 microprocessor is used as the microprocessor 23. The chirp-z-transform circuits 22 and inverse chirp-z-transform circuits 45 are implemented by means of charge-coupled device (CCD) 64-point, finite impulse response, chirp-weighted filters. The low-pass filter 40 is used as an anti-aliasing filter, and is a CCD 64-point, finite impulse response device.

The system operates with an input clock frequency of 7.68 MHz. From this frequency the timing generator 66 and the controllers 64, 65 derive the required clocking signals for the remainder of the system. The microprocessor 23 operates at a clock rate of 3.84 MHz, the chirp-z-transform circuitry 22 operates at a 30 KHz sample rate and the inverse chirp-z-transform circuits 45 operate at a 120 KHz sample rate. With this timing, a new impulse response for the correlator 25 is calculated every 2.13 milliseconds. The low-pass filter 40 has a cutoff frequency (3 db) of 0.125 $F_c$, where $F_c$ is a clock frequency. The clock signal supplied places the 3db point at 12 kHz with the first null occurring at 15 kHz. The chirp-z-transform circuitry 22 calculates thirty-three (33) unique values of the input spectrum at a clock rate of 30 kHz. The values of the spectrum are converted to digital information by the analog-to-digital converter 43.

Digital data is applied to the digital portion of the system by means of the parallel peripheral interface (PPI) circuitry 60. The data flow is thus under the control of the microprocessor 23 and its programmable read-only memory (PROM) 67. In order to increase the speed of operation of the matched filter 21, the external multiplier circuits 52 are utilized to calculate the matched filter frequency response (transfer function).

The values of the transfer function are stored in the random access memory (RAM) 53. The inverse chirp-z-transform circuits 45 are utilized to calculate the impulse response of the filter 21 at a clock rate of 120 Hz. Once a known signal is identified in the utilization device 26, the control signal 57, identified as ACQ input to buffer 61, inhibits the calculation of the input spectrum by the chirp-z-transform circuits 22 and continues the conversion of data in the random access memory 53 to maintain the same filter characteristics.

The impulse response coefficients derived from the inverse chirp-z-transform circuits 45 are applied to the 32-point analog-to-analog correlator 25. These coefficients are updated every 2.13 milliseconds, either with a new impulse response or with the same impulse response when controlled by the ACQ control signal 57. The correlator 25 includes an analog shift register which allows data to be shifted in and then strobed to multipliers at the correct time. Strobing occurs once every 2.13 milliseconds. The input signal is then correlated with the filter impulse response as indicated in equation (9) to produce the filtered output 38.

Referring now to FIG. 6, there is shown a block diagram which represents the steps in the method of processing applied signals containing known signals and noise signals, which method provides an output signal that maximizes the known signal-to-noise power ratio for varying noise power distributions. The steps of this method include Fourier transforming the applied signals, indicated by box 76, and then estimating the noise power spectral density of the input signals, represented by box 77. A transfer function is then calculated utilizing the noise power estimates and stored information characterizing the known signals, represented by box 78. The transfer function is then inverse Fourier transformed to produce impulse response signals, as shown in box 79. Finally the impulse response is correlated with the input signals as indicated by box 80 to provide output signals 38 having an enhanced signal-to-noise power ratio.

Thus there has been described an adaptive matched filter which provides output signals which have an enhanced signal-to-noise power ratio irrespective of changes in the noise power distribution. In addition, a method of processing applied signals to produce an enhanced signal-to-noise power ratio has also been provided.

Although there have been described above specific arrangements of an adaptive matched filter in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the annexed claims.

What is claimed is:

1. An adaptive matched filter which enhances the signal-to-noise power ratio of signals applied to, and processed by, the adaptive matched filter, said filter comprising:

first means responsive to signals applied to said adaptive matched filter, the signals comprising known signals and noise signals, where the first means functions to provide signals that represent the Fourier transform of the signals applied to the adaptive matched filter and where the first means also functions to provide first output signals which are indicative of the noise power spectral density of signals that represent the Fourier transform of the signals applied to the adaptive matched filter means;

second means coupled to said first means, where the second means functions to provide signals which are derived from said first output signals and stored signals which are indicative of said known signals and where the second means also functions to provide second output signals which are indicative of the transfer function of the adaptive matched filter;

third means coupled to said second means to receive said second output signals, where the third means functions to provide third output signals that represent the inverse Fourier transform of said second output signals; and fourth means coupled to said third means, where the fourth means functions to combine the signals applied to the adaptive matched filter with said third output signals in a manner which filters the signals applied to the adaptive matched filter to substantially remove the noise signals therefrom, and where the fourth means also functions to provide output signals from the adaptive matched filter in which the signal-to-noise power ratio is enhanced.

2. The adaptive matched filter of claim 1 wherein said first means comprises:

means for providing signals that represent the Fourier transform of the signals applied to the adaptive matched filter; and means for determining the noise power spectral density of the signals that represent the Fourier transform of the signals applied to the adaptive matched filter.

3. The adaptive matched filter of claim 1 wherein said first means includes chirp-z-transform means for providing signals that represent the Fourier transform of the signals applied to the adaptive matched filter.

4. The adaptive matched filter of claim 3 wherein said chirp-z-transform means comprises a plurality of Charge-Coupled-Device finite impulse response filters.

5. The adaptive matched filter of claim 1 wherein said second means comprises microprocessor circuitry which determines signals representing the transfer function of the adaptive matched filter.

6. The adaptive matched filter of claim 1 wherein said third means comprises chirp-z-transform means for providing signals representing the inverse Fourier transform of said second output signals.

7. The adaptive matched filter of claim 1 wherein said fourth means comprises analog-to-analog correlation means for combining the signals applied to the adaptive matched filter with said third output signals.

8. An adaptive matched filter which provides an output signal having an enhanced signal-to-noise ratio for varying noise power distributions for signals having known spectral content embedded in the noise, comprising:

Fourier transform circuitry for providing signals representing the Fourier transform of signals applied thereto, said applied signals comprising noise signals and signals embedded therein having a known spectral content;

means for providing an output signal indicative of the noise power of said Fourier transform representing signals;

analog-to-digital conversion means for converting analog signals provided by said output signal providing means into digital signals;

computer means which stores data indicative of said signals of known spectral content for receiving said digital signals and processing said digital signals in a predetermined manner to provide a signal indicative of the noise power spectral distribution of said signals, and further processing said noise power signals and said stored data to provide signals representing the transfer function of said adaptive matched filter;

inverse Fourier transform circuitry for providing signals representing the inverse Fourier transform of signals representing said transfer function; and correlation means for combining the signals applied to the adaptive matched filter with signals representing said transfer function in a predetermined manner to provide an output signal which has an enhanced signal-to-noise power ratio.

9. A method of processing signals that enhances the signal-to-noise power ratio of the signals for varying noise power distributions, where the signals contain known signals and noise signals, the method comprising the steps of:

(a) obtaining signals that represent the Fourier transform of the signals that contain known signals and noise signals;

(b) estmating a power spectral density of the noise signals contained in the signals that contain known signals and noise signals;

(c) calculating a transfer function by using both estimates of the power spectral density derived in step (b) and stored information that characterizes the known signals and providing signals that represent the transfer function;

(d) performing an inverse Fourier transform upon the transfer function signals to produce impulse response signals; and (e) correlating the signals that contain known signals and noise signals with the impulse response signals to produce a filter output signal that has an enhanced signal-to-noise power ratio.

* * * * *